US009103741B2

(12) United States Patent
Baik et al.

(10) Patent No.: US 9,103,741 B2
(45) Date of Patent: Aug. 11, 2015

(54) METHODS AND SYSTEMS FOR ASSESSING RESIDUAL LIFE OF TURBOMACHINE AIRFOILS

(75) Inventors: Sanghum Baik, Niskayuna, NY (US); Vivek Venugopal Badami, Schenectady, NY (US); Yogesh Kesrinath Potdar, Niskayuna, NY (US); Adrian G Loghin, Rexford, NY (US); Nuo Sheng, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 813 days.

(21) Appl. No.: 12/869,822

(22) Filed: Aug. 27, 2010

(65) Prior Publication Data

US 2012/0051911 A1    Mar. 1, 2012

(51) Int. Cl.
*G06F 7/60* (2006.01)
*G06F 17/10* (2006.01)
*G06G 7/48* (2006.01)
*G01M 5/00* (2006.01)
*G06F 17/50* (2006.01)

(52) U.S. Cl.
CPC .......... *G01M 5/0016* (2013.01); *G01M 5/0033* (2013.01); *G01M 5/0066* (2013.01); *G06F 17/50* (2013.01); *G06F 17/5009* (2013.01); *G06F 17/5018* (2013.01)

(58) Field of Classification Search
CPC .. G06F 17/50; G06F 17/5009; G06F 17/5018
USPC ..................................................... 703/7, 2, 6
See application file for complete search history.

(56) References Cited

U.S. PATENT DOCUMENTS

| 4,102,603 | A | 7/1978 | Smith et al. |
| 4,380,172 | A | 4/1983 | Imam et al. |
| 4,408,294 | A | 10/1983 | Imam |
| 4,502,337 | A | 3/1985 | Archer |
| 4,751,657 | A | 6/1988 | Imam et al. |
| 5,213,475 | A | 5/1993 | Peterson et al. |
| 5,493,511 | A | 2/1996 | Wincheski et al. |
| 5,654,500 | A | 8/1997 | Herron et al. |
| 6,415,486 | B1 | 7/2002 | Prevey, III |

(Continued)

OTHER PUBLICATIONS

Valerity Krutiy, NPL, "Sub-modeling of thermal mechanical fatigue crack propagation", Thesis, Dec. 2009.*

(Continued)

*Primary Examiner* — Omar Fernandez Rivas
*Assistant Examiner* — Angel Calle
(74) *Attorney, Agent, or Firm* — Ann M. Agosti (57) ABSTRACT

Methods, systems and computer program products for assessing residual life of an airfoil, which would experience high cycle fatigue failure under at- or near-resonance vibration condition, are provided. The method includes receiving, at a processing system, at least one vibration response parameter associated with the airfoil. The method processes at least one cracked airfoil finite element model. Processing the cracked airfoil finite element model includes accessing the cracked airfoil finite element model, computing a modal stress intensity factor (SIF) of the cracked airfoil finite element model using fracture mechanics based finite element analysis, and computing a vibratory SIF based, at least in part, on the modal SIF and the at least one vibration response parameter. The method then computes a residual life indicator of the airfoil based, at least in part, on the vibratory SIF.

15 Claims, 4 Drawing Sheets

(56) References Cited

U.S. PATENT DOCUMENTS

| | | | |
|---|---|---|---|
| 6,606,910 | B1 | 8/2003 | Nishimura et al. |
| 6,761,536 | B1 | 7/2004 | Bash et al. |
| 6,813,592 | B1 | 11/2004 | Dhondt |
| 7,162,373 | B1 * | 1/2007 | Kadioglu et al. ............... 702/35 |
| 7,387,030 | B1 | 6/2008 | deLaneuville |
| 7,480,573 | B2 | 1/2009 | Toyosada |
| 7,568,886 | B2 | 8/2009 | Hohmann et al. |
| 7,684,936 | B2 | 3/2010 | Bechhoefer |
| 7,824,147 | B2 * | 11/2010 | Morris et al. ..................... 415/1 |
| 7,941,281 | B2 * | 5/2011 | Rai et al. ......................... 702/34 |
| 2004/0126239 | A1 | 7/2004 | Gautreau et al. |
| 2004/0225474 | A1 * | 11/2004 | Goldfine et al. ............. 702/183 |
| 2005/0249592 | A1 | 11/2005 | Gautreau et al. |
| 2007/0271023 | A1 | 11/2007 | Morris et al. |
| 2007/0272018 | A1 * | 11/2007 | Shadman et al. ............... 73/579 |
| 2009/0133381 | A1 | 5/2009 | Holmes et al. |
| 2010/0235110 | A1 * | 9/2010 | Wang et al. ..................... 702/35 |
| 2011/0060568 | A1 * | 3/2011 | Goldfine et al. .................. 703/6 |

OTHER PUBLICATIONS

E. Seinturier, NPL, "Chapter 4—Method for FOD/HCF Interaction evaluation", Jun. 2005, http://www.rto.nato.int/pubs/rdp.asp?RDP=RTO-TR-AVT-094.*

S. M. O. Tavares, NPL, "Modeling of fatigue crack growth in monolithic integral stiffened panels taking into account residual stress", Mar. 2010.*

NPL, "Fatigue: Total life Approaches", Aug. 2009.*

Donald W. Rhymer, NPL, "Stress intensity solutions of thermal fatigue induced cracks in a thin plate hot spot using LEFM and finite element analysis", ScienceDirect, 2008.*

Search Report and Written Opinion from corresponding EP Application No. 11176781.0-1236 dated Feb. 2, 2012.

Galenne et al., "A modal approach to linear fracture mechanics for dynamic loading at low frequency". Journal of Sound & Vibration, vol. 299, No. 1-2, pp. 283-297, Jan. 9, 2007.

Walls et al., "Damage Tolerance Based Life Prediction in Gas Turbine Engine Blades Under Vibratory High Cycle Fatigue", Journal of Engineering for Gas Turbines and Power, vol. No. 09, Issue No. 01, pp. 143-146, 1997.

Hou et al., "An Investigation of Fatigue Failures of Turbine Blades in a Gas Turbine Engine by Mechanical Analysis", Engineering Failure Analysis, vol. No. 09, Issue No. 02, pp. 201-211, 2002.

Beres et al., "Critical Components Life Update for Gas Turbine Engines-Case study of an International Collaboration", Proceedings of ASME Turbo Expo 2008: Power for Land, Sea and Air, Paper No. GT2008-50655, pp. 203-213, Jun. 9-13, 2008.

Hou et al., "3D Crack Growth Analysis and Its Correlation with Experiments for Critical Turbine components under an International Collaborative Program", Proceedings of ASME Turbo Expo 2008: Power for Land, Sea and Air, Paper No. GT2008-50548, pp. 185-193, Jun. 9-13, 2008.

* cited by examiner

METHODS AND SYSTEMS FOR ASSESSING RESIDUAL LIFE OF TURBOMACHINE AIRFOILS

BACKGROUND

Embodiments presented herein relate to residual life assessment of airfoils such as turbine rotors.

Turbine and compressor airfoils operate under extreme conditions and may develop cracks during normal operating conditions. The cracks may develop due to high cycle fatigue, especially when a natural frequency of the airfoil matches the frequency of an excitation force experienced during normal turbomachinery operation. Power generation turbomachinery is typically exposed to external disturbances that have frequencies of 50/60 Hz and integral multiples of such frequencies. Airfoils used in such power generation machinery are designed to have a natural frequency different from the typical frequencies of external disturbances.

Apart from known external disturbances, the turbomachinery may experience unanticipated excitations that match airfoil frequencies in normal service. Such unanticipated excitations may cause the airfoil to resonate, thus exposing the airfoil to elevated amounts of vibration. Such vibration may cause cracks to form on airfoils or airfoil supporting elements such as the platform and dovetails. The cracks may propagate and rapidly extend due to the high cycle fatigue and vibration. Neglected cracks in the turbomachine airfoils may lead to unplanned outages.

Some known residual life assessment techniques to predict crack propagation rates are based on observed crack data obtained by periodic inspections. Such methods use statistical models, probabilistic models, and interpolation techniques based on observed data for obtaining expected future crack dimensions. Some of these types of methods do not always yield sufficiently accurate results. Often these types of methods may also not provide information about the underlying mechanism causing damage to a structural component, which may be critical in extending the residual life of the structural component.

Some residual life assessment techniques for low cycle fatigue and creep fatigue compute the crack growth rate based on the static response of the airfoil under a static load such as, for example, a time-invariant centrifugal load, steady-state airfoil metal temperature, and steady-state gas pressure on airfoil surface. Such techniques do not account for high cycle fatigue conditions, thus making such techniques unsuitable for assessing residual life under high cycle fatigue conditions.

Some other known residual life assessment techniques for high cycle fatigue may employ forced vibration response analysis to arrive at more accurate assessments. However, such techniques are computationally intense and often require large amounts of computation capacity.

Thus, there is a need for methods and systems which overcome these and other shortcomings associated with the known solutions.

BRIEF DESCRIPTION

Embodiments presented herein provide a system and a method for assessing residual life of an airfoil at risk of experiencing high cycle fatigue failure from an elevated level of vibration at or near a resonance condition.

In accordance with one embodiment, a method for assessing residual life of an airfoil includes receiving, at a processing system, at least one vibration response parameter associated with the airfoil. The method processes at least one cracked airfoil finite element model. Processing the cracked airfoil finite element model includes accessing the cracked airfoil finite element model, computing a modal stress intensity factor (SIF) of the cracked airfoil finite element model using fracture mechanics based finite element analysis, and computing a vibratory SIF based, at least in part, on the modal SIF and the at least one vibration response parameter.

In accordance with one embodiment, a system for assessing residual life of an airfoil includes a receiver module for receiving at least one vibration response parameter associated with the airfoil. The system further includes a finite element analysis engine for processing at least one cracked airfoil finite element model. The finite element analysis engine processes the cracked airfoil finite element model by accessing the cracked airfoil finite element model, computing a modal stress intensity factor (SIF) of the cracked airfoil finite element model using fracture mechanics based finite element analysis, and computing a vibratory SIF based, at least in part, on the modal SIF, and the at least one vibration response parameter. The system includes an assessment module for computing a residual life indicator of the airfoil based, at least in part, on the vibratory SIFs.

In accordance with another embodiment, a computer program product comprising a non-transitory computer readable medium encoded with computer-executable instructions for assessing residual life of an airfoil is provided. The computer-executable instructions, when executed, cause one or more processors to receive at least one vibration response parameter associated with the airfoil. The computer-executable instructions further cause the one or more processors to process at least one cracked airfoil finite element model. The processing includes accessing the cracked airfoil finite element model, computing a modal stress intensity factor (SIF) of the cracked airfoil finite element model using fracture mechanics based finite element analysis, and computing a vibratory SIF based, at least in part, on the modal SIF, and the at least one vibration response parameter. The computer-executable instructions then cause the one or more processors to compute a residual life indicator of the airfoil based, at least in part, on the vibratory SIFs.

These and other advantages and features will be more readily understood from the following detailed description of preferred embodiments that are provided in connection with the accompanying drawings.

DETAILED DESCRIPTION

Embodiments presented herein provide methods, systems and computer program products for assessing residual life of turbomachine airfoils experiencing high cycle fatigue under conditions of at or near resonance vibration. In one embodiment, the method employs physics based 3D finite element analysis for computing residual life of an airfoil.

Figure 1:
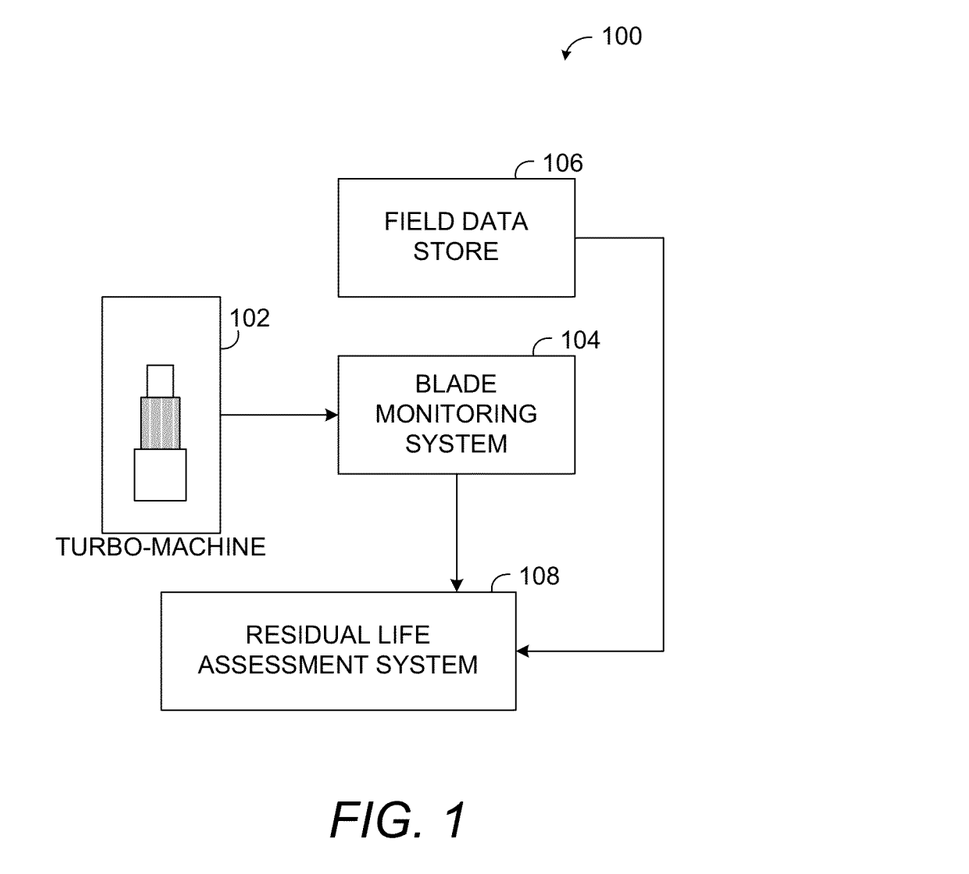
FIG. 1 is a block diagram of an environment in which embodiments of a residual life assessment system may operate.

FIG. 1 illustrates an example environment 100 in which various embodiments may operate. Environment 100 includes a turbomachine 102, a blade monitoring system 104, a field data store 106, and a residual life assessment system 108. The turbomachine 102 may include, without limitation, a gas turbine engine, a steam turbine, and so forth.

The blade monitoring system 104 monitors operating conditions of a turbomachine airfoil, such as a compressor airfoil. The blade monitoring system 104 may monitor vibration response parameters such as, for example, blade vibration amplitude, blade vibration frequency, and airfoil structural damping. The blade monitoring system 104 may also monitor crack data for the airfoil. The crack data may include crack location, crack size, crack propagation direction, or combinations thereof. In addition to operating conditions, and the crack data, the blade monitoring system 104 may also monitor airfoil structural characteristics such as airfoil resonant frequency. The blade monitoring system 104 may include sensors to monitor the operating conditions, the crack data, and the airfoil structural characteristics. The crack data and the airfoil structural characteristics may alternatively be imported from testing and inspection systems or be received as input from a technician.

The crack data and the airfoil structural characteristics may alternatively or additionally be received from the field data store 106. The field data store 106 may store field data of a number of turbomachines 102. The field data store 106 may store crack data obtained from inspections of the turbomachines 102. In one embodiment of the present invention, an ultrasonic inspection technique or an optical inspection technique may be used to detect a crack and obtain the crack data. It will be appreciated that the particular inspection techniques are presented as examples and do not limit the scope of the embodiments presented herein. The field data store 106 may also store the design parameters of the turbomachines 102 including, but not limited to, airfoil geometry, airfoil blade dimensions, number of blades in the airfoils, rated operating speed, rated operating load, and so forth.

In one implementation the field data store 106 may be local to the facility where the turbomachine 102 may be deployed. In other implementations, the field data store 106 may be located at a central location such as a facility of the manufacturer of the turbomachine 102 and connected through a suitable network to the residual life assessment system 108. Further, the residual life assessment system 108 may be connected to a multiple turbomachines 102 deployed at the same or different locations. Alternatively, each turbomachine 102 may be connected to a dedicated residual life assessment system 108.

Figure 2:
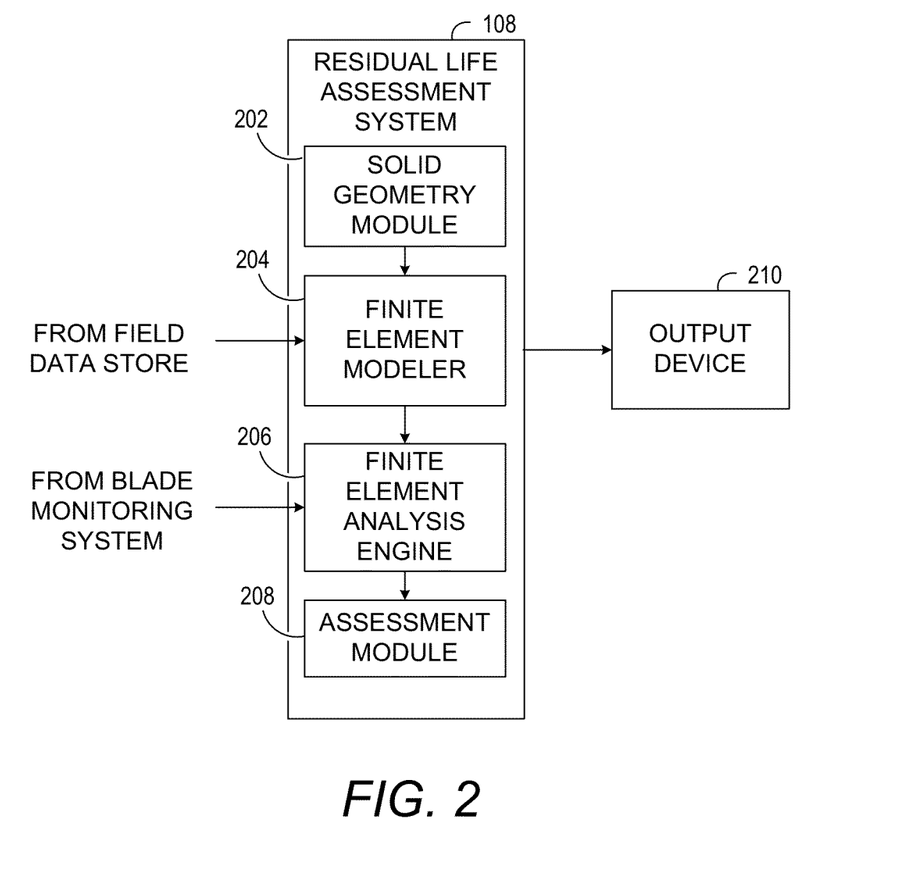
FIG. 2 is a block diagram of a residual life assessment system, in accordance with one embodiment.

FIG. 2 is a block diagram of an exemplary residual life assessment system 108, in accordance with one embodiment. The residual life assessment system 108 includes a solid geometry module 202, a finite element modeler 204, a finite element analysis engine 206, and an assessment module 208. The residual life assessment system 108 may be coupled to an output device 210 to present one or more residual life indicators. The residual life assessment system 108 may also be coupled to a receiver module (not shown in FIG. 2). The receiver module may receive the crack data, the turbomachine design parameters, and the operating conditions. The receiver module may be coupled to the blade monitoring system 104 to receive the operating conditions and to the field data store 106 to receive the crack data and the turbomachine design parameters. The receiver module may communicate with the blade monitoring system 104 and the field data store 106 using a suitable interface such as, but not limited to, a UART, a USART, a serial port, a Controller Area Network bus, an IEEE 802.15 Ethernet interface, a wireless telemetry network, and so forth.

The solid geometry module 202 generates a solid geometry model of the airfoils of the turbomachine 102. The solid geometry module 202 accepts the design parameters of the turbomachine 102 such as airfoil geometry, airfoil dimensions, and number of airfoils in the turbomachine compressor or turbine. The solid geometry module 202 then generates a solid geometry model of the airfoil based on the design parameters. In addition to the design parameters, the solid geometry module 202 may also accept the crack data to generate the solid geometry model of a cracked airfoil. The solid geometry module 202 generates the solid geometry models for a number of cracked airfoils, with different levels of structural damage such as crack sizes, and crack propagation directions. Each of the cracked airfoil solid geometry models corresponds to a distinct cracked airfoil in the field. The solid geometry module 202 then passes on the solid geometry model to the finite element modeler 204.

The finite element modeler 204 meshes the solid geometry model to generate the finite element model. The finite element modeler 204 may generate the finite element model using polyhedron elements such as, tetrahedron elements, for example. However, any other suitable polyhedron elements such as, but not limited to, hexahedron, octahedron, dodecahedron, and icosahedron elements may also be used to generate the finite element model. The mesh density may be selected in accordance with the precision required and available computational power of the residual life assessment system 108. In one implementation, the finite element modeler 204 may generate the finite element model of a single airfoil of the turbomachine compressor or turbine. Non-linear contact dynamics may be applied for nodes of the finite element model at the dovetail surfaces in contact with the rotor slots. Such non-linear contact dynamics may capture physics with high-definition resolution and provide accurate computation of the mean SIF. Alternatively, a fixed-fixed boundary condition may be applied to the nodes of the dovetail surfaces in contact with the rotor slots, under an assumption that the airfoil dovetail is in full contact with the rotor slots without any micro slip motion. Such an assumption may enable a computationally simple finite element model, at the cost of high-definition accuracy. The finite element modeler 204 may then transfer the finite element model to the finite element analysis engine 206.

The finite element analysis engine 206 then computes the stress intensity factors (SIF) using fracture mechanics based algorithms. The finite element analysis engine 206 computes a mean SIF for static response parameters, and modal SIFs (in other words, peak alternating SIFs) for a vibration response mode. The finite element analysis engine 206 may use fracture mechanics based algorithms such as J-integral methods, M-integral methods, or Displacement Extrapolation methods to compute the mean SIF and the modal SIFs. Although specific examples of fracture mechanics based algorithms are presented herein, the finite element analysis engine 206 may employ any known fracture mechanics based algorithm for computing the mean SIF and the modal SIFs.

The finite element analysis engine 206 then takes into consideration the vibration response parameters to account for stresses caused due to vibration at high cycle conditions at and near resonance frequencies. The finite element analysis engine 206 may compute a vibratory SIF based on the modal SIFs and the vibration response parameters. In one implementation, the finite element analysis engine 206 may convert the modal SIFs to a vibratory SIF at resonant frequency using the instrumented airfoil tip vibration amplitude at a certain interval and the airfoil structural damping. The finite element analysis engine 206 may then compute the vibratory SIF at near-resonant frequency using suitable single degree of freedom forced response equations, taking into consideration a frequency detuning parameter. In order to compute the frequency detuning parameter, the finite element analysis engine 206 performs modal analysis to identify the resonant speed of the undamaged airfoil, and the resonant speeds of the cracked airfoils. An exemplary equation for computing the resonant frequency of the cracked airfoil may be given as:

$$r' = \frac{f_{n0} + \Delta f}{f_{n0}} \quad \text{(Equation 1)}$$

where r' is the cracked airfoil resonant frequency, fn0 is the undamaged airfoil resonant frequency, and $\Delta f$ is the frequency detuning parameter.

A curve of resonant speed versus crack size gives the frequency detuning parameter. The finite element analysis engine 206 may then compute a cracked airfoil vibration amplitude. An example equation for computing the cracked airfoil vibration amplitude is given as:

$$x'_0 = \frac{2x_{r0}\zeta_n}{\sqrt{(1-r'^2)^2 + (2\zeta_n r')^2}} \quad \text{(Equation 2)}$$

where xr0 is the vibration amplitude of the undamaged airfoil, $\zeta_n$ is the modal viscous damping, and r' is the cracked airfoil resonant frequency obtained from Equation 1.

The cracked airfoil vibration amplitude x'0 and the instrumented airfoil vibration amplitude may be used to compute a scaling factor given as:

$$\text{Scaling\_factor} = \frac{x'_0}{\text{vibration\_amplitude}} \quad \text{(Equation 3)}$$

The finite element analysis engine 206 may then compute the vibratory SIF by multiplying the modal SIF with the scaling factor.

The airfoil vibration amplitude and stress response of the airfoil depends on factors such as, for example, the airfoil resonant frequencies, airfoil structural damping, excitation force amplitude, and the nodal diameter of the vibration modes. Another factor affecting the airfoil vibration amplitude is non-uniform fluid flow through the turbomachine caused by factors such as nozzle asymmetry, geometry variations of wakes, leakage flows and disturbances in the turbomachine structure such as joints. The large number of factors poses significant difficulty in accurate estimation of airfoil vibration amplitude, often requiring complex computational fluid dynamics or forced response analysis. Such techniques require a significant amount of computing power, and time. Computing the vibratory SIF based on the measured vibration response parameter, and the modal SIFs overcomes these shortcomings.

The finite element analysis engine 206 then computes an effective SIF based on the mean SIF and the vibratory SIF. The mean SIF accounts for the static load on the turbomachine airfoil, and the vibratory SIF accounts for the dynamic load on the turbomachine airfoil. The finite element analysis engine 206 may employ conventional physics based fracture mechanics techniques to compute the effective SIF.

The assessment module 208 receives the effective SIF values and computes a crack growth rate based on the effective SIF. The assessment module 208 may use the Walker equation for computing $\Delta$Keff taking into consideration a vibratory stress ratio. The Walker equation is a model that incorporates mean stress effects through the use of a load ratio, R. The assessment module 208 may then use Paris' Law to compute the crack growth rate. A general form of Paris' equation is given as:

$$\frac{da}{dN} = C[\Delta Keff]^n = C\left[\frac{\Delta K}{(1-R)^{1-m}}\right]^n \quad \text{(Equation 4)}$$

where a=crack size, N=mission cycle count, $\Delta$Keff=effective SIF range, stress ratio R=$K_{min}/K_{max}$ where Kmax and Kmin are computed using the mean SIF and the vibratory SIF, and C, n, and m are based on material properties of the turbomachine airfoil.

The assessment module 208 may also use a Sigmoidal representation of the crack growth rate. The Sigmoidal representation plots SIF against the crack growth rate, and identifies a range of SIFs where the crack may not propagate, a range of SIFs where the crack propagates steadily, and a range of SIFs where the crack propagates rapidly, prior to airfoil failure.

The assessment module 208 then numerically integrates the crack growth rate for the various levels of structural damage to obtain a crack size-versus-cycle count curve. The crack size-versus-cycle count curve indicates the residual life of the turbomachine airfoil under the monitored dynamic load conditions for a given crack size before the turbomachine airfoil experiences catastrophic failure. Further, fracture mechanics methods and geometric methods may be introduced to assess when the airfoil would experience catastrophic failure. One fracture mechanics method is based on the fact that the cracked airfoil may experience a rapid crack growth when the Kmax of the cracked airfoil is larger than the critical SIF of the material of the airfoil, indicating impending catastrophic failure. One geometric method predicts impending catastrophic failure when the crack passes through an uncracked ligament of the airfoil. Either or both of the fracture mechanics and geometric methods may be used to identify impending catastrophic failure. The assessment module 208 may be tuned to provide a conservative residual life indicator to identify the turbomachine airfoils impending failure well in advance of the actual failure.

The output device 210 may then present the residual life indicator. The output device 210 may present the residual life indicator to technician on a suitable display. Alternatively, the output device 210 may transmit the residual life indicator to a central monitoring station using a suitable network such as, but not limited to, an IEEE 802.15 Ethernet network, a telephone network, a wireless network, and so forth.

In one embodiment, the individual modules described herein, are implemented as computer executable instructions stored on a non-transitory computer readable medium. The non-transitory computer readable medium may be a Random Access Memory (RAM), Read Only Memory (ROM), flash memory or any suitable storing equipment. The computer readable medium may have stored thereon operating system and other software for controlling the overall operations of the residual life assessment system 108.

Figure 3:
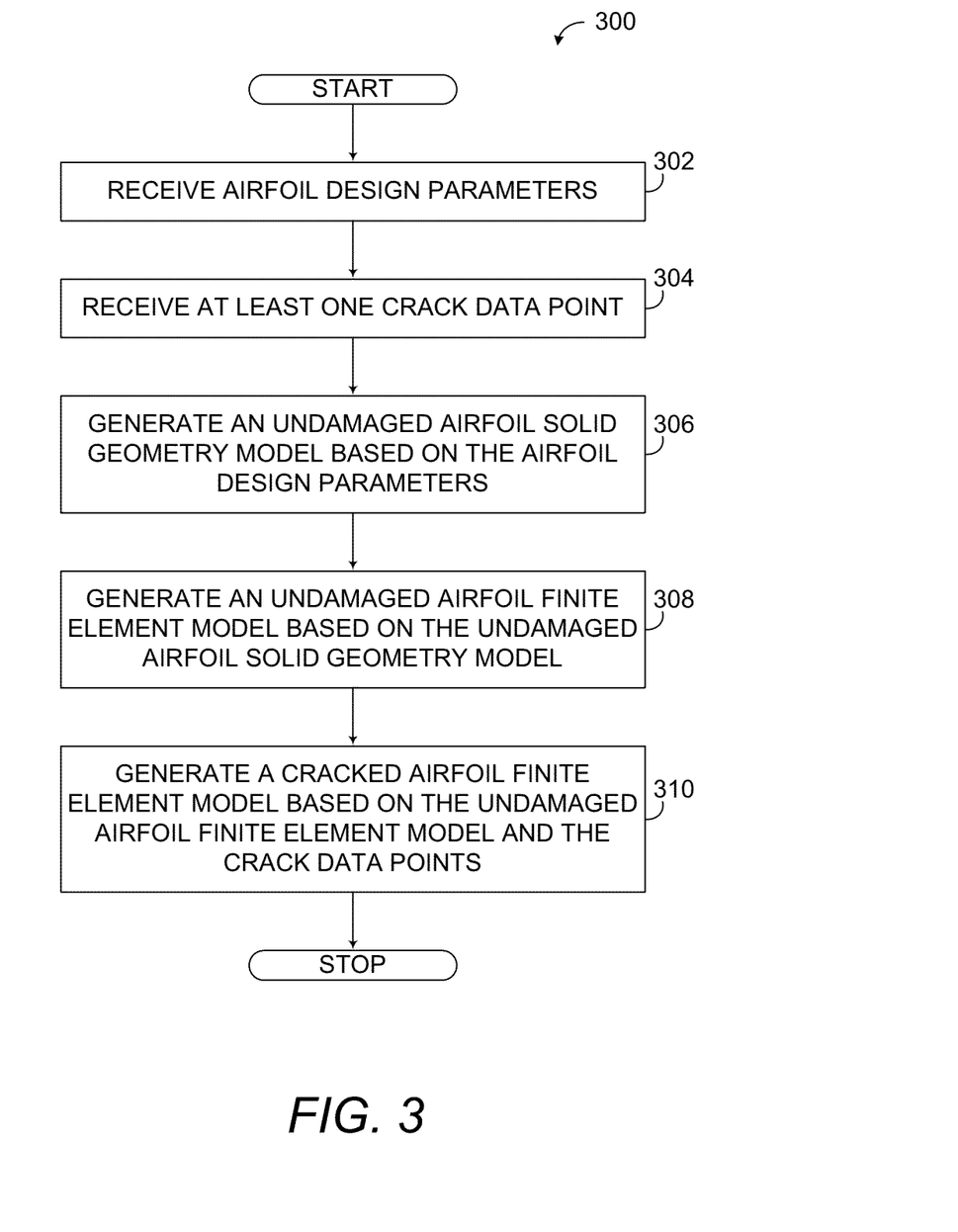
FIG. 3 is a flowchart illustrating an exemplary process of creating a finite element model of an airfoil.

FIG. 3 is a flowchart illustrating an exemplary process 300 for generating a cracked airfoil finite element model, according to one embodiment. At step 302, the solid geometry module 202 receives at least one airfoil design parameter. The airfoil design parameters may include parameters such as airfoil geometry, airfoil dimensions, and number of airfoils in the turbomachine compressor or turbine, for example.

At step 304, the solid geometry module 202 receives at least one crack parameter including, but not limited to, a crack initiation position, a crack propagation direction, a crack size, and a crack geometry. In one implementation, the solid geometry module 202 receives the crack parameters from field data store 106. The crack parameters comprise actual field data from cracked airfoil inspections, in one embodiment.

At step 306, the solid geometry module 202 generates an undamaged airfoil solid geometry model based on the at least one airfoil design parameter. The solid geometry module 202 may employ automated solid geometry modeling algorithms to generate the solid geometry model of the airfoil. Alternatively, the field data store 106 may have stored therein solid geometry models of various different turbomachine airfoils. The solid geometry module 202 may directly receive the solid geometry models of the airfoil being assessed for residual life. The solid geometry module 202 may then transfer the solid geometry model to the finite element modeler 204.

At step 308, the finite element modeler 204 generates an undamaged airfoil finite element model based, at least in part, on the undamaged airfoil solid geometry model. The finite element modeler 204 may mesh the solid geometry model using suitable polyhedron elements, such as tetrahedron elements, for example. The accuracy, and precision required by the residual life assessment system 108 govern the mesh size used by the mesher.

At step 310, the finite element modeler 204 generates at least one cracked airfoil finite element model based on the crack parameters and the undamaged airfoil finite element model. In one implementation, the finite element modeler 204 generates a number of cracked airfoil finite element models, each corresponding to a distinct cracked airfoil inspected in the field. The finite element modeler 204 re-meshes the region of the crack at high resolution, i.e. small mesh size, to improve precision.

The finite element analysis engine 206 processes the cracked airfoil finite element models to compute the mean SIF, the modal SIF, the vibratory SIF, and the effective SIF. The effective SIF is used to compute the crack growth rate, and subsequently the residual life indicator for the airfoil. The finite element analysis engine 206 may also process the undamaged airfoil finite element model to identify resonant frequency of the undamaged airfoil.

Figure 4:
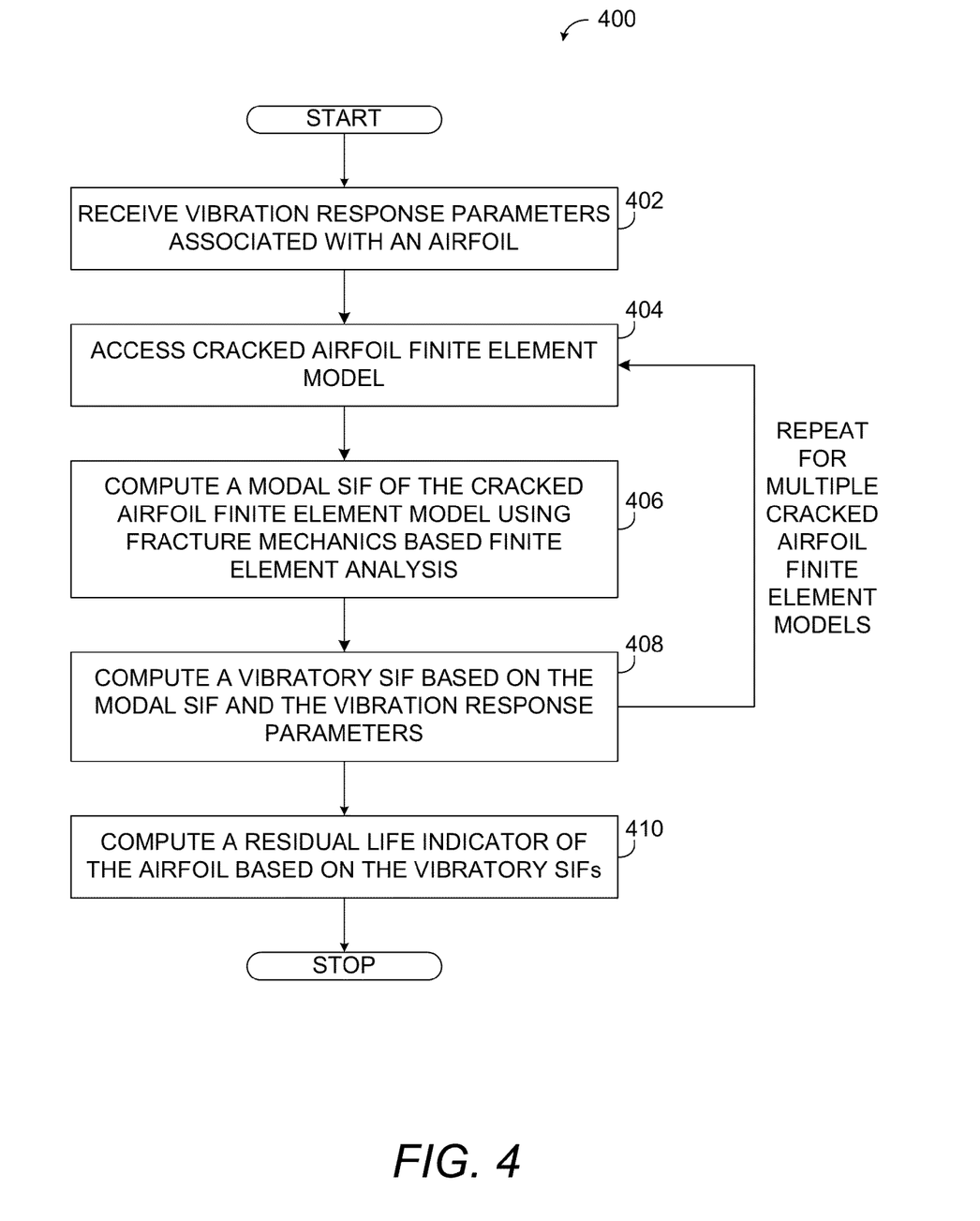
FIG. 4 is a flowchart illustrating an exemplary process of residual life assessment, in accordance with one embodiment.

FIG. 4 is a flowchart illustrating an exemplary process 400 for assessing residual life of the airfoil, according to one embodiment. At step 402, the finite element analysis engine 206 receives vibration response parameters associated with the airfoil. The vibration response parameters may include, without limitation, an airfoil excitation frequency, an airfoil vibration amplitude, and an airfoil structural damping.

The finite element analysis engine 206 then processes each of the cracked airfoil finite element models corresponding to distinct cracked airfoils inspected in the field. Steps 404 through 408 are the processing steps that the finite element analysis engine 206 performs for each of the cracked airfoil finite element models.

At step 404, the finite element analysis engine 206 accesses the cracked airfoil finite element model. The finite element analysis engine 206 may access the cracked airfoil finite element model from the finite element modeler 204. Alternatively, the finite element analysis engine 206 may access the cracked airfoil finite element model from a data store having stored thereon the cracked airfoil finite element models generated by the finite element modeler 204.

At step 406, the finite element analysis engine 206 computes a modal stress intensity factor (SIF) of the cracked airfoil finite element model by finite element analysis using physics based fracture mechanics techniques.

At step 408, the finite element analysis engine 206 computes a vibratory SIF based, on the modal SIF, and the vibration response parameters. In other words, the finite element analysis engine 206 factors the vibration response experienced by the airfoil at or near resonance into computing the SIF. The use of measured vibration response parameters simplifies and speeds up the computation of the vibratory SIF, which would otherwise require a substantially higher computation power, and take substantially longer to compute using conventional techniques such as forced response analysis, or computational fluid dynamics.

The finite element analysis engine 206 now has a table of vibratory SIFs corresponding to the various cracked airfoil finite element models.

At step 410, the finite element analysis engine 206 computes a residual life indicator of the airfoil based, at least in part, on the vibratory SIFs. In one specific implementation, the finite element analysis engine 206 computes an effective SIF based on the vibratory SIF and a mean SIF using conventional fracture mechanics techniques. The finite element analysis engine 206 then computes a crack growth rate based on the effective SIF. The finite element analysis engine 206 numerically integrates the crack growth rate taking into account the mission cycle data such as, but not limited to, number of turbomachine fired starts and turbomachine fired hours. The finite element analysis engine 206 may then compute the residual life indicator based on a curve of the crack size versus the mission cycle count. The computation of the residual life indicator is described in detail in conjunction with FIG. 2.

Although embodiments of the present invention have been described with reference to specific hardware and software components, those skilled in the art will appreciate that different combinations of hardware and/or software components may also be used, and that particular operations described as being implemented in hardware might also be implemented in software or vice versa. Other embodiments will be evident to those of ordinary skill in the art.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims.

The invention claimed is:

1. A method comprising:
receiving, at a processing system, at least one vibration response parameter associated with an airfoil, wherein the at least one vibration response parameter comprises at least one of an airfoil excitation frequency, an airfoil vibration amplitude, and an airfoil structural damping;
using the processing system for:
computing a modal stress intensity factor (SIF) of at least one cracked airfoil finite element model using fracture mechanics based finite element analysis; and
computing a vibratory SIF based, at least in part, on the modal SIF and a scaling factor comprising a variable number based on the at least one vibration response parameter; and
computing a residual life indicator of the airfoil based, at least in part, on the vibratory SIF.

2. The method of claim 1, further comprising computing at least one mean SIF of the at least one cracked airfoil finite element model using fracture mechanics based finite element analysis; and
   wherein computing the residual life indicator further comprises taking into account the at least one mean SIF.

3. The method of claim 1, wherein computing the residual life indicator further comprises taking into account at least one material property parameter.

4. The method of claim 1 further comprising:
   receiving, at the processing system, at least one airfoil design parameter;
   receiving, at the processing system, at least one crack parameter;
   generating an undamaged airfoil solid geometry model based on the at least one airfoil design parameter;
   generating an undamaged airfoil finite element model based, at least in part, on the undamaged airfoil solid geometry model; and
   generating the at least one cracked airfoil finite element model based, at least in part, on the at least one crack parameter and the undamaged airfoil finite element model.

5. The method of claim 4, wherein the at least one crack parameter comprises at least one of a crack initiation position, a crack propagation direction, a crack size, and a crack geometry.

6. The method of claim 1, wherein the residual life indicator includes at least one of a crack growth rate, a cycle count assessment, and a crack size versus cycle count assessment.

7. A system comprising:
   at least one of a sensor and an inspection system for obtaining data indicative of at least one vibration response parameter, wherein the at least one vibration response parameter comprises at least one of an airfoil excitation frequency, an airfoil vibration amplitude, and an airfoil structural damping;
   a receiver module for receiving the at least one vibration response parameter associated with an airfoil from the at least one of the sensor and the inspection system or from a field data store housing information from the at least one of the sensor and the inspection system;
   a finite element analysis engine for:
   computing a modal stress intensity factor (SIF) of at least one cracked airfoil finite element model using fracture mechanics based finite element analysis; and
   computing a vibratory SIF based, at least in part, on the modal SIF and a scaling factor comprising a variable number based on the at least one vibration response parameter; and
   an assessment module for computing a residual life indicator of the airfoil based, at least in part, on the vibratory SIFs.

8. The system of claim 7 further comprising:
   a receiver module for receiving at least one airfoil design parameter and at least one crack parameter;
   a solid geometry module for generating an undamaged airfoil solid geometry model based on the at least one airfoil design parameter; and
   a finite element generator module for:
   generating an undamaged airfoil finite element model based, at least in part, on the undamaged airfoil solid geometry model; and
   generating the at least one cracked airfoil finite element model based, at least in part, on the at least one crack parameter and the undamaged airfoil finite element model.

9. The system of claim 7, wherein the at least one crack parameter comprises at least one of a crack initiation position, a crack propagation direction, a crack size, and a crack geometry.

10. The system of claim 7, wherein the residual life indicator includes at least one of a crack growth rate, a cycle count assessment, and a crack size versus cycle count assessment.

11. A computer program product comprising a non-transitory computer readable medium encoded with computer-executable instructions, wherein the computer-executable instructions, when executed, cause one or more processors to:
   receive at least one vibration response parameter associated with an airfoil, wherein the at least one vibration response parameter comprises at least one of an airfoil excitation frequency, an airfoil vibration amplitude, and an airfoil structural damping;
   compute a modal stress intensity factor (SIF) of at least one cracked airfoil finite element model using fracture mechanics based finite element analysis; and
   compute a vibratory SIF based, at least in part, on the modal SIF, and a scaling factor comprising a variable number based on the at least one vibration response parameter;
   compute a residual life indicator of the airfoil based, at least in part, on the vibratory SIFs.

12. The computer program product of claim 11 further comprising computer executable instructions to cause the one or more processors to:
   compute at least one mean SIF of the at least one cracked airfoil finite element model using fracture mechanics based finite element analysis; and
   compute the residual life indicator taking into account the at least one mean SIF.

13. The computer program product of claim 11 further comprising computer executable instructions to cause the one or more processors to:
   receive at least one airfoil design parameter;
   receive at least one crack parameter;
   generate an undamaged airfoil solid geometry model based on the at least one airfoil design parameter;
   generate an undamaged airfoil finite element model based, at least in part, on the undamaged airfoil solid geometry model; and
   generate the at least one cracked airfoil finite element model based, at least in part, on the at least one crack parameter and the undamaged airfoil finite element model.

14. The computer program product of claim 13, wherein the at least one crack parameter comprises at least one of a crack initiation position, a crack propagation direction, a crack size, and a crack geometry.

15. The computer program product of claim 11, wherein the residual life indicator includes at least one of a crack growth rate, a cycle count assessment, and a crack size versus cycle count assessment.

* * * * *